United States Patent
Hu

(10) Patent No.: US 11,495,569 B2
(45) Date of Patent: Nov. 8, 2022

(54) METAL-DIELECTRIC BONDING METHOD AND STRUCTURE

(71) Applicant: Yangtze Memory Technologies Co., Ltd., Wuhan (CN)

(72) Inventor: Siping Hu, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

(21) Appl. No.: 16/855,299

(22) Filed: Apr. 22, 2020

(65) Prior Publication Data

US 2021/0210459 A1    Jul. 8, 2021

Related U.S. Application Data

(63) Continuation of application No. PCT/CN2020/070595, filed on Jan. 7, 2020.

(51) Int. Cl.
*H01L 23/00* (2006.01)
*H01L 27/146* (2006.01)

(52) U.S. Cl.
CPC .............. *H01L 24/80* (2013.01); *H01L 24/08* (2013.01); *H01L 27/1469* (2013.01);
(Continued)

(58) Field of Classification Search
CPC .......... H01L 2224/80013; H01L 2224/80896; H01L 24/80; H01L 2224/08135;
(Continued)

(56) References Cited

U.S. PATENT DOCUMENTS 5,569,620 A    10/1996   Linn et al.
6,962,835 B2 *  11/2005  Tong ..................... B23K 20/02
                                            257/E21.705
(Continued)

FOREIGN PATENT DOCUMENTS

CN    102593087 A    7/2012
CN    103367465 A    10/2013
(Continued)

OTHER PUBLICATIONS

Peter Ramm et al., Handbook of Wafer Bonding, Nov. 30, 2016, p. 157-161, National Defense Industry Press, Beijing, China.
(Continued)

*Primary Examiner* — David A Zarneke
(74) *Attorney, Agent, or Firm* — Anova Law Group, PLLC

(57) ABSTRACT

A metal-dielectric bonding method includes providing a first semiconductor structure including a first semiconductor layer, a first dielectric layer on the first semiconductor layer, and a first metal layer on the first dielectric layer, where the first metal layer has a metal bonding surface facing away from the first semiconductor layer; planarizing the metal bonding surface; applying a plasma treatment on the metal bonding surface; providing a second semiconductor structure including a second semiconductor layer, and a second dielectric layer on the second semiconductor layer, where the second dielectric layer has a dielectric bonding surface facing away from the second semiconductor layer; planarizing the dielectric bonding surface; applying a plasma treatment on the dielectric bonding surface; and bonding the first semiconductor structure with the second semiconductor structure by bonding the metal bonding surface with the dielectric bonding surface.

20 Claims, 8 Drawing Sheets

(52) U.S. Cl.
CPC ............... *H01L 27/14634* (2013.01); *H01L 2224/0812* (2013.01); *H01L 2224/08121* (2013.01); *H01L 2224/08145* (2013.01); *H01L 2224/80011* (2013.01); *H01L 2224/80013* (2013.01); *H01L 2224/80031* (2013.01); *H01L 2224/80047* (2013.01); *H01L 2224/80894* (2013.01); *H01L 2224/80896* (2013.01)

(58) Field of Classification Search
CPC .......... H01L 2224/008145; H01L 2224/0812; H01L 2224/08121; H01L 2224/80894
See application file for complete search history.

(56) References Cited

U.S. PATENT DOCUMENTS

| | | | |
|---|---|---|---|
| 7,453,150 | B1 | 11/2008 | McDonald |
| 7,842,540 | B2 * | 11/2010 | Tong .................. H01L 21/481 257/788 |
| 8,278,186 | B2 * | 10/2012 | Cha .................. H01L 21/02046 134/1.1 |
| 9,048,283 | B2 * | 6/2015 | Liu ........................ H01L 24/03 |
| 9,520,361 | B2 * | 12/2016 | Kang ................ H01L 27/14621 |
| 9,748,198 | B2 * | 8/2017 | Liu ........................ H01L 24/05 |
| 9,997,467 | B2 * | 6/2018 | Shao .................... H01L 23/544 |
| 10,886,252 | B2 * | 1/2021 | Peng .................... H01L 21/185 |
| 2013/0153093 | A1 | 6/2013 | Vandroux et al. |
| 2015/0054149 | A1 | 2/2015 | Purushothaman et al. |
| 2015/0097022 | A1 | 4/2015 | Di et al. |
| 2016/0111386 | A1 | 4/2016 | England et al. |
| 2016/0141263 | A1 * | 5/2016 | Lin .................. H01L 21/76254 257/637 |
| 2019/0088618 | A1 * | 3/2019 | Tsumura ................ H01L 24/80 |
| 2020/0075539 | A1 * | 3/2020 | Luo .................... H01L 25/0652 |

FOREIGN PATENT DOCUMENTS

| | | |
|---|---|---|
| CN | 105374774 A | 3/2016 |
| CN | 106711055 A | 5/2017 |
| CN | 109686711 A | 4/2019 |
| KR | 20080051287 A | 6/2008 |
| TW | 332914 B | 6/1998 |
| TW | 201145487 A | 12/2011 |
| TW | I371070 B | 8/2012 |
| TW | 201517175 A | 5/2015 |
| TW | 201616626 A | 5/2016 |
| TW | 201639098 A | 11/2016 |
| TW | 201843830 A | 12/2018 |
| TW | 202002326 A | 1/2020 |

OTHER PUBLICATIONS

J.Q. Lu et al., Die-on-Wafer and Wafer-Level Three-Dimensional (3D) Integration of Heterogeneous IC Technologies for RF-Microwave-Millimeter Applications. Materials, Integration and Packaging Issues for High-Frequency Devices II, Dec. 31, 2005. vol. 833, New York, USA.

The World Intellectual Property Organization (WIPO) International Search Report for PCT/CN2020/070595 dated Sep. 27, 2020 4 pages.

Koester, S.J. et al. Wafer-level 3D Integration Technology, IBM J.Res. &. Dev., Nov. 30, 2008, vol. 52, No. 6.

Gueguen, Pierric et al. Physics of Direct Bonding: Applications to 3D Heterogeneous or Monolithic Integration, Microelectronic Engineering, Aug. 23, 2009, p. 477-484.

Ko, Cheng Ta et al., Low Temperature Bonding Technology for 3D Integration, Microelectronics Reliability, Apr. 16, 2011, p. 302-311.

* cited by examiner

METAL-DIELECTRIC BONDING METHOD AND STRUCTURE

CROSS-REFERENCE TO RELATED APPLICATION

This application is a continuation of International Application No. PCT/CN2020/070595, filed on Jan. 7, 2020, the entire content of which is incorporated herein by reference.

FIELD OF THE TECHNOLOGY

This application relates to the field of bonding technologies and, specifically, to a metal-dielectric bonding method and structure.

BACKGROUND OF THE DISCLOSURE

Dielectric bonding is often used for bonding a carrier wafer with a device or bonding a device with another device. The devices for bonding may include through-silicon vias. In dielectric bonding, a dielectric surface is bonded with another dielectric surface. Hybrid bonding often includes bonding of a hybrid surface that includes a dielectric portion and a metal portion, between devices. For bonding metal surfaces, thermal compression is often used to form metal-metal bonding.

As two semiconductor structures are bonded together for 3-dimensional integration, more complications are introduced. Factors such as heat or an electromagnetic radiation generated by one semiconductor structure may affect operations of one or more semiconductor structures in the bonded structures. For example, heat generated by one semiconductor structure may not only affect its own operations, but also affect operations of the other semiconductor structure.

The disclosed methods and systems are directed to solve one or more problems set forth above and other problems.

SUMMARY

One aspect of the present disclosure includes a metal-dielectric bonding method. The metal-dielectric bonding method includes providing a first semiconductor structure including a first semiconductor layer, a first dielectric layer on the first semiconductor layer, and a first metal layer on the first dielectric layer, where the first metal layer has a metal bonding surface facing away from the first semiconductor layer; planarizing the metal bonding surface; applying a plasma treatment on the metal bonding surface; providing a second semiconductor structure including a second semiconductor layer, and a second dielectric layer on the second semiconductor layer, where the second dielectric layer has a dielectric bonding surface facing away from the second semiconductor layer; planarizing the dielectric bonding surface; applying a plasma treatment on the dielectric bonding surface; and bonding the first semiconductor structure with the second semiconductor structure by bonding the metal bonding surface with the dielectric bonding surface.

Other aspects of the present disclosure can be understood by those skilled in the art in light of the description, the claims, and the drawings of the present disclosure.

DESCRIPTION OF EMBODIMENTS

The following describes the technical solutions in the embodiments of the present invention with reference to the accompanying drawings. Wherever possible, the same reference numbers will be used throughout the drawings to refer to the same or like parts. Apparently, the described embodiments are merely some but not all the embodiments of the present invention. Other embodiments obtained by a person skilled in the art based on the embodiments of the present invention without creative efforts shall fall within the protection scope of the present disclosure.

In the specification, claims, and accompanying drawings of the present disclosure, the terms "first," "second," "third," "fourth," and the like (if exist) are intended to distinguish between similar objects but do not necessarily indicate an order or sequence. It should be understood that the embodiments of the present disclosure described herein can be implemented, for example, in orders other than the order it lustrated or described herein.

Some or all of the processes may be chosen according to actual needs to achieve purposes of the present disclosure. Some or all of the components may be chosen according to actual needs to achieve purposes of the present disclosure.

Figure 1:
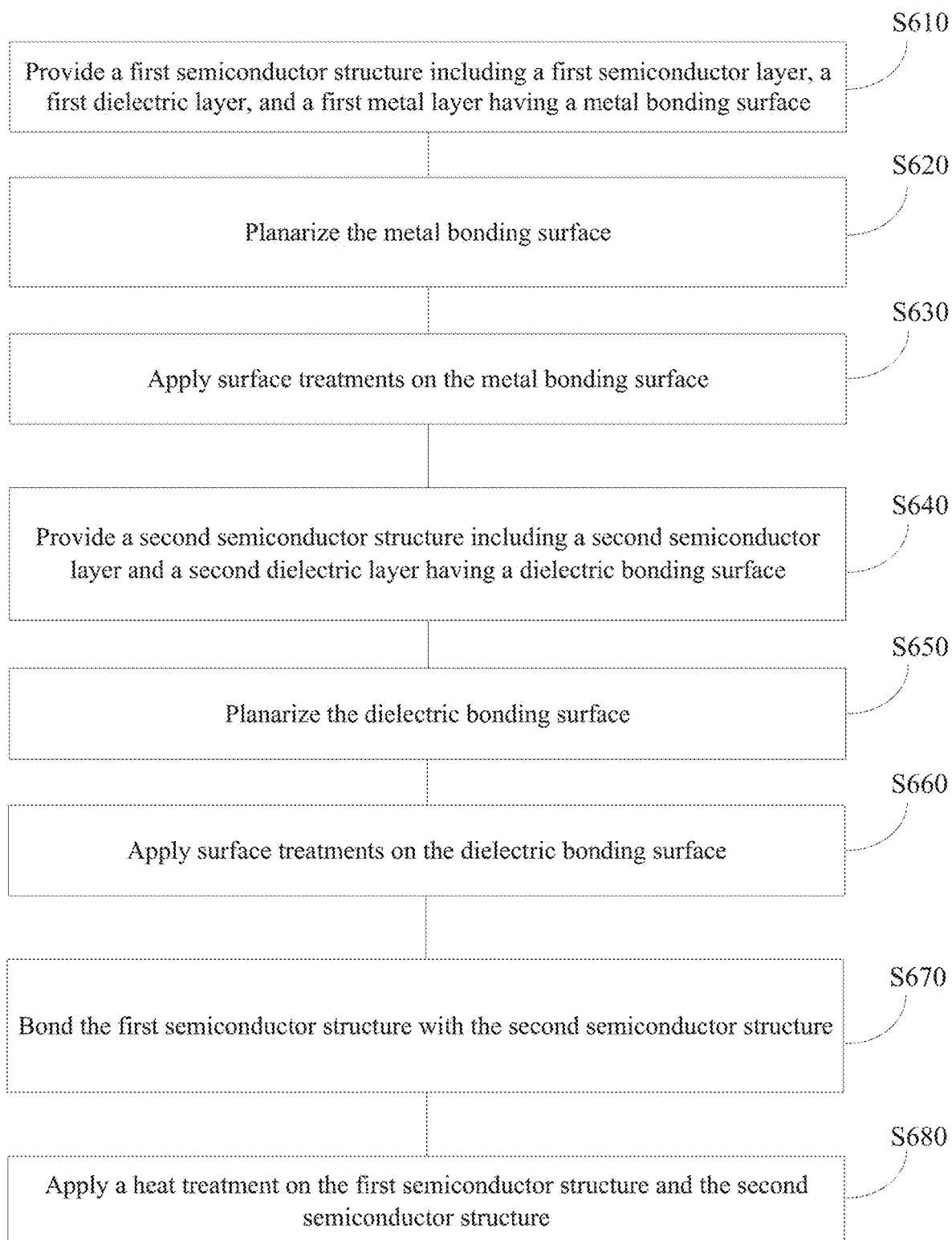
FIG. 1 illustrates a flowchart of an exemplary metal-dielectric bonding method consistent with various disclosed embodiments of the present disclosure.

The present disclosure provides a metal-dielectric bonding method. FIG. 1 illustrates a flowchart of an exemplary metal-dielectric bonding method consistent with various disclosed embodiments of the present disclosure. FIGS. 2-14 and 16-17 illustrate schematic views of structures at certain stages of the metal-dielectric bonding process.

Referring to FIG. 1, a first semiconductor structure including a first semiconductor layer, a first dielectric layer, and a first metal layer having a metal bonding surface is provided (S610). FIGS. 2-5 show structures at certain stages of the process for providing the first semiconductor structure that includes a first semiconductor layer, a first dielectric layer, and a first metal layer.

Figure 2:
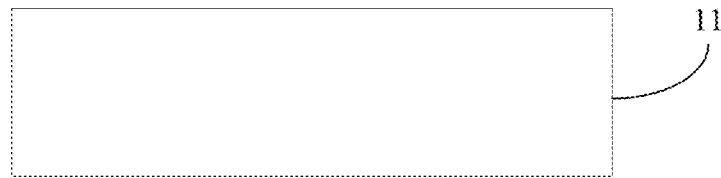
FIG. 2 illustrates a schematic view of an exemplary first semiconductor layer consistent with various disclosed embodiments of the present disclosure.

FIG. 2 illustrates a schematic view of an exemplary first semiconductor layer consistent with various disclosed embodiments of the present disclosure. Referring to FIG. 2, a first semiconductor layer 11 is provided. In some embodiments, the first semiconductor layer 11 may be a silicon substrate.

Figure 3:
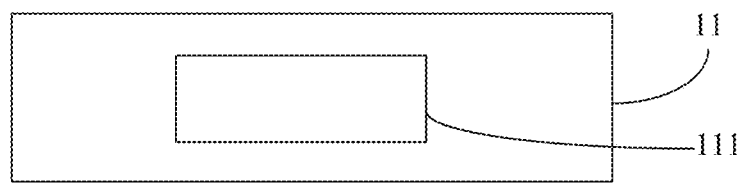
FIG. 3 illustrates another schematic view of an exemplary first semiconductor layer consistent with various disclosed embodiments of the present disclosure.

FIG. 3 illustrates another schematic view of an exemplary first semiconductor layer consistent with various disclosed embodiments of the present disclosure. Referring to FIG. 3, the first semiconductor layer 11 may include a first semiconductor device 111 formed therein.

In some embodiments, the first semiconductor device 111 may be, for example, a power device. The power device may generate heat.

In other embodiments, the first semiconductor device 111 may be, for example, a complementary metal-oxide-semiconductor (CMOS) device. The CMOS device may be used in various applications such as a CMOS image sensor (CIS), a data convertor, etc.

In some embodiments, the first semiconductor device 111 may be, for example, a device that generates an electromagnetic radiation. The electromagnetic radiation may be, for example, visible light, infrared light, radio wave, ultraviolet, or any combination thereof.

In some embodiments, the first semiconductor device 111 may be, for example, a device that is exposed to an electromagnetic radiation. The electromagnetic radiation may be, for example, visible light, infrared light, radio wave, ultraviolet, or any combination thereof.

Figure 4:
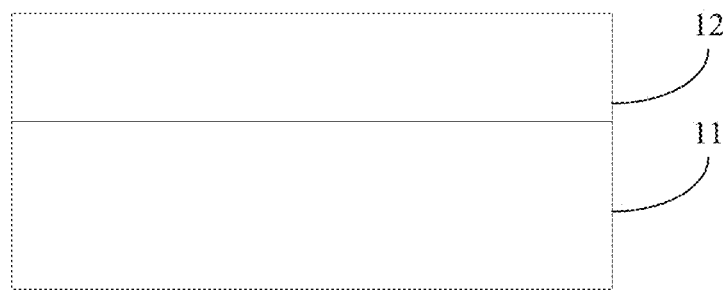
FIG. 4 illustrates a schematic view of an exemplary first dielectric layer on an exemplary first semiconductor layer consistent with various disclosed embodiments of the present disclosure.

FIG. 4 illustrates a schematic view of an exemplary first dielectric layer on an exemplary first semiconductor layer consistent with various disclosed embodiments of the present disclosure. Referring to FIG. 4, a first dielectric layer 12 is formed on a first semiconductor layer 11.

In some embodiments, a material of the first dielectric layer 12 may include, for example, silicon oxide, silicon oxycarbide, silicon nitride, silicon carbon nitride, or any combination thereof.

In some embodiments, the first dielectric layer 12 may be formed on the first semiconductor layer 11 by deposition, such as chemical vapor deposition (CVD), physical vapor deposition (PVD), atomic layer deposition (ALD), or any other suitable deposition process.

Figure 5:
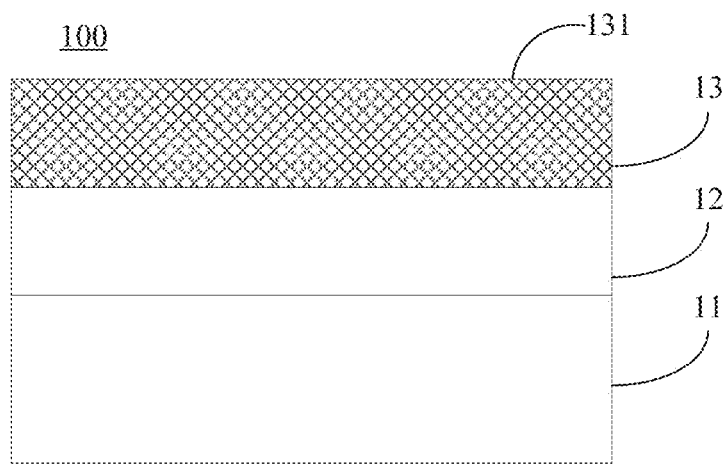
FIG. 5 illustrates a schematic view of an exemplary first semiconductor structure consistent with various disclosed embodiments of the present disclosure.

FIG. 5 illustrates a schematic view of an exemplary first semiconductor structure consistent with various disclosed embodiments of the present disclosure. Referring to FIG. 5, the first semiconductor structure 100 includes the first semiconductor layer 11, the first dielectric layer 12, and a first metal layer 13. The first metal layer 13 is formed on the first dielectric layer 12. The first metal layer 13 includes a metal bonding surface 131, and the metal bonding surface 131 faces away from the first semiconductor layer 11. The metal bonding surface 131 may be a surface that is to be bonded with a bonding surface of another semiconductor structure.

In some embodiments, a material of the first metal layer 13 may be tantalum, titanium, copper, or any combination thereof. In some embodiments, the first metal layer 13 may be formed on the first dielectric layer 12 by deposition, such as chemical vapor deposition (CVD), physical vapor deposition (PVD), atomic layer deposition (ALD), or any other suitable deposition. For example, as a physical vapor deposition, magnetron sputtering deposition may be used to deposit the first metal layer 13, where one or more sputtering targets may be bombarded to eject materials, and the ejected materials may be deposited on the first dielectric layer 12.

Referring to FIG. 1, the metal bonding surface is planarized (S620). Correspondingly, FIG. 6 illustrates another schematic view of an exemplary first semiconductor structure after planarization consistent with various disclosed embodiments of the present disclosure.

Figure 6:
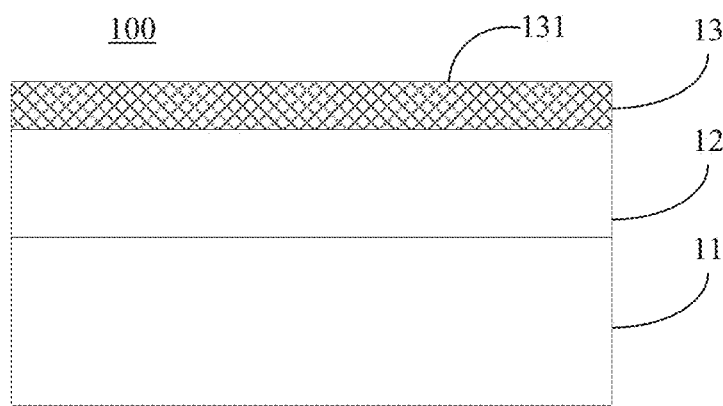
FIG. 6 illustrates another schematic view of an exemplary first semiconductor structure after planarization consistent with various disclosed embodiments of the present disclosure.

Referring to FIG. 6, the metal bonding surface 131 is flat after the metal bonding surface 131 is planarized, as the planarization process removes materials causing rough topography. In some embodiments, the metal bonding surface 131 may be planarized by chemical mechanical planarization or any other suitable planarization. In some embodiments, the metal bonding surface 131 may be planarized, such that a surface roughness of the metal bonding surface 131 may be, for example, approximately 0.5 nm or less.

Referring to FIG. 1, surface treatments are applied on the metal bonding surface (S630). Correspondingly, FIG. 7 illustrates another schematic view of an exemplary first semiconductor structure under surface treatments consistent with various disclosed embodiments of the present disclosure.

Figure 7:
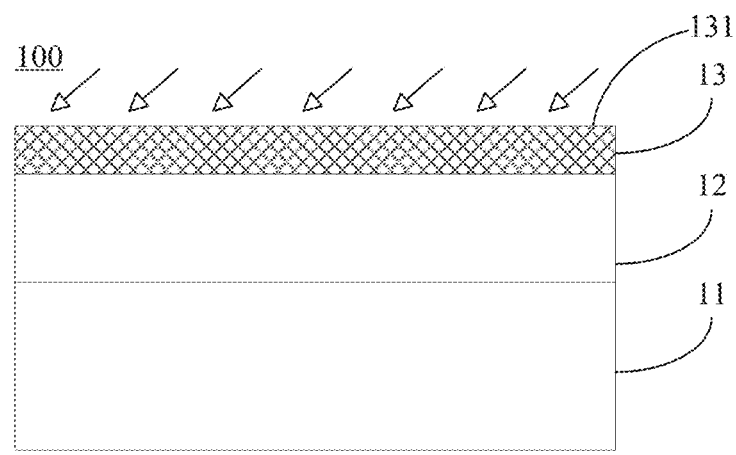
FIG. 7 illustrates another schematic view of an exemplary first semiconductor structure under surface treatments consistent with various disclosed embodiments of the present disclosure.

Referring to FIG. 7, closed sharp arrows indicate that surface treatments are applied on the metal bonding surface 131 of the first metal layer 13 in the first semiconductor structure 100. The surface treatments may include a plasma treatment and a cleaning treatment.

In some embodiments, the plasma treatment may include applying on the metal bonding surface 131 nitrogen plasma, oxygen plasma, argon plasma, argon-hydrogen plasma, or any other suitable plasma. Nitrogen plasma may be generated by introducing nitrogen gas to a plasma system; oxygen plasma may be generated by introducing oxygen gas to a plasma system; and argon plasma may be generated by introducing argon gas into a plasma system. Argon-hydrogen plasma may be generated by introducing argon and hydrogen gases into a plasma system. Argon-hydrogen plasma may include mixture of argon plasma and hydrogen plasma.

In some embodiments, the cleaning treatment may include using deionized water to clean the metal bonding surface 131.

In some embodiments, the cleaning treatment may include using a hydrophilic chemical substance to clean the metal bonding surface 131. The hydrophilic chemical substance may be, for example, ammonia solution, weak acid, or any other suitable chemical substance. The weak acid may be, for example, hydrofluoric acid, benzoic acid, acetic acid, propanoic acid, acrylic acid, or any other suitable weak acid.

Figure 8:
FIG. 8 illustrates a schematic view of an exemplary second semiconductor layer consistent with various disclosed embodiments of the present disclosure.
Figure 9:
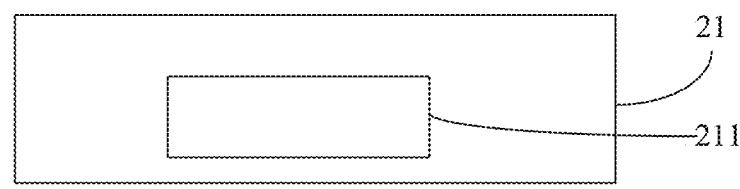
FIG. 9 illustrates another schematic view of an exemplary second semiconductor layer consistent with various disclosed embodiments of the present disclosure.
Figure 10:
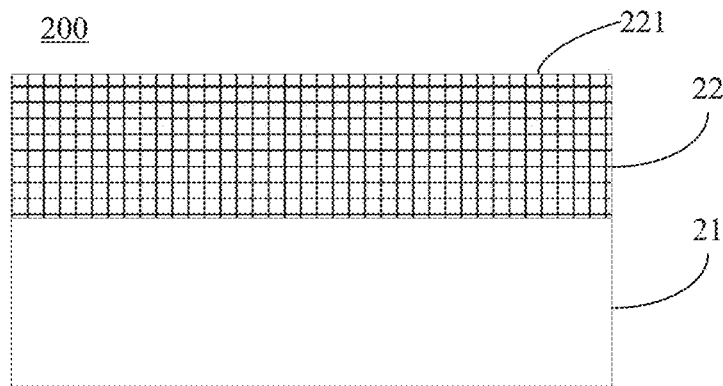
FIG. 10 illustrates a schematic view of an exemplary second semiconductor structure consistent with various disclosed embodiments of the present disclosure.

Referring to FIG. 1, a second semiconductor structure including a second semiconductor layer and a second dielectric layer having a dielectric bonding surface is provided (S640). FIGS. 8-10 show structures at certain stages of the process for providing the second semiconductor structure that includes a second semiconductor layer and a second dielectric layer.

FIG. 8 illustrates a schematic view of an exemplary second semiconductor layer consistent with various disclosed embodiments of the present disclosure. Referring to FIG. 8, a second semiconductor layer 21 is provided. In some embodiments, the second semiconductor layer 21 may be a silicon substrate.

FIG. 9 illustrates another schematic view of an exemplary second semiconductor layer consistent with various disclosed embodiments of the present disclosure. Referring to FIG. 9, the second semiconductor layer 21 may include a second semiconductor device 211.

In some embodiments, the second semiconductor device 211 may be, for example, a power device. The power device may generate heat.

In some embodiments, the second semiconductor device 211 may be, for example, a complementary metal-oxide-semiconductor (CMOS) device. The CMOS device may be used in various applications such as a CMOS image sensor, a data convertor, etc.

In some embodiments, the second semiconductor device 211 may be, for example, a device that generates an electromagnetic radiation. The electromagnetic radiation may be, for example, visible light, infrared light, radio wave, ultraviolet, or any combination thereof.

In some embodiments, the second semiconductor device 211 may be, for example, a device that is exposed to an electromagnetic radiation. The electromagnetic radiation may be, for example, visible light, infrared light, radio wave, ultraviolet, or any combination thereof.

FIG. 10 illustrates a schematic view of an exemplary second semiconductor structure consistent with various disclosed embodiments of the present disclosure. Referring to FIG. 10, the second semiconductor structure 200 includes a second semiconductor layer 21 and a second dielectric layer 22, and the second dielectric layer 22 is formed on the second semiconductor layer 21.

The second dielectric layer 22 includes a dielectric bonding surface 221, and the dielectric bonding surface 221 faces away from the second semiconductor layer 21. The dielectric bonding surface 221 may be a surface that is to be bonded with a bonding surface of the first semiconductor structure.

In some embodiments, a material of the second dielectric layer 22 may include, for example, silicon oxide, silicon oxycarbide, silicon nitride, silicon carbon nitride, or any combination thereof.

In some embodiments, the second dielectric layer 22 may be formed on the second semiconductor layer 21 by deposition, such as chemical vapor deposition (CVD), physical vapor deposition (PVD), atomic layer deposition (ALD), or any other suitable deposition.

Referring to FIG. 1, the dielectric bonding surface is planarized (S650). Correspondingly, FIG. 11 illustrates a schematic view of an exemplary second semiconductor structure after planarization consistent with various disclosed embodiments of the present disclosure.

Figure 11:
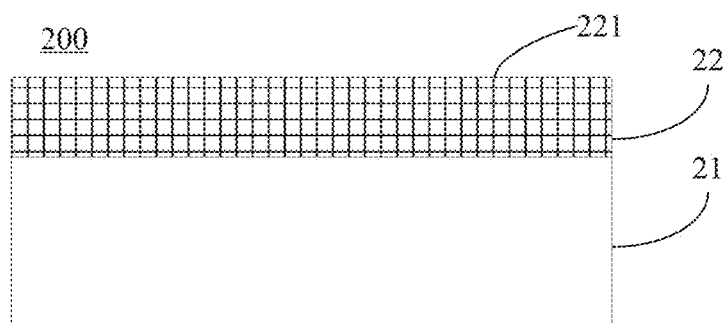
FIG. 11 illustrates a schematic view of an exemplary second semiconductor structure after planarization consistent with various disclosed embodiments of the present disclosure.

Referring to FIG. 11, the dielectric bonding surface 221 is flat after the dielectric bonding surface 221 is planarized, as the planarization process removes materials causing rough topography. In some embodiments, the dielectric bonding surface 221 may be planarized by chemical mechanical planarization or any other suitable planarization. In some embodiments, the dielectric bonding surface 221 may be planarized, such that a surface roughness of the dielectric bonding surface 221 may be, for example, approximately 0.5 nm or less.

Referring to FIG. 1, surface treatments are applied on the dielectric bonding surface (S660). Correspondingly, FIG. 12 illustrates a schematic view of an exemplary second semiconductor structure under surface treatments consistent with various disclosed embodiments of the present disclosure.

Figure 12:
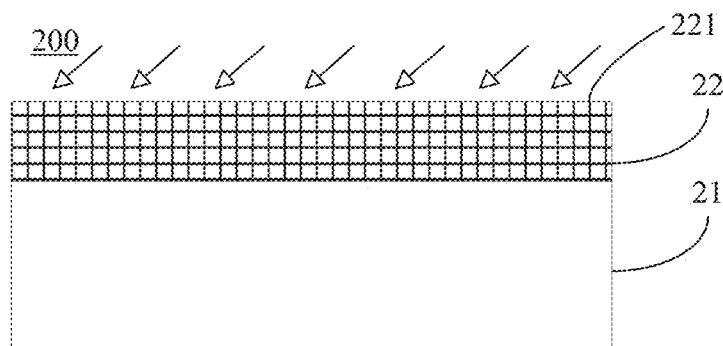
FIG. 12 illustrates a schematic view of an exemplary second semiconductor structure under surface treatments consistent with various disclosed embodiments of the present disclosure.

Referring to FIG. 12, closed sharp arrows indicate that surface treatments are applied on the dielectric bonding surface 221 of the second dielectric layer 22 of the second semiconductor structure 200. The surface treatments may include a plasma treatment and a cleaning treatment.

In some embodiments, the plasma treatment may include applying on the dielectric bonding surface 221 nitrogen plasma, oxygen plasma, argon plasma, argon-hydrogen plasma, or any other suitable plasma. Nitrogen plasma may be generated by introducing nitrogen gas to a plasma system; oxygen plasma may be generated by introducing oxygen gas to a plasma system; and argon plasma may be generated by introducing argon gas into a plasma system. Argon-hydrogen plasma may be generated by introducing argon and hydrogen gases into a plasma system. Argon-hydrogen plasma may include mixture of argon plasma and hydrogen plasma.

In some embodiments, the cleaning treatment may include using deionized water to clean the dielectric bonding surface 221.

In some embodiments, the cleaning treatment may include using a hydrophilic chemical substance to clean the dielectric bonding surface 221. The hydrophilic chemical substance may be, for example, ammonia solution, weak acid, or any other suitable chemical substance. The weak acid may be, for example, hydrofluoric acid, benzoic acid, acetic acid, propanoic acid, acrylic acid, or any other suitable weak acid.

Referring to FIG. 1, the first semiconductor structure is bonded with the second semiconductor structure (S670). Correspondingly, FIGS. 13-14 and 16-17 illustrate schematic views of structures of metal-dielectric bonding.

Figure 13:
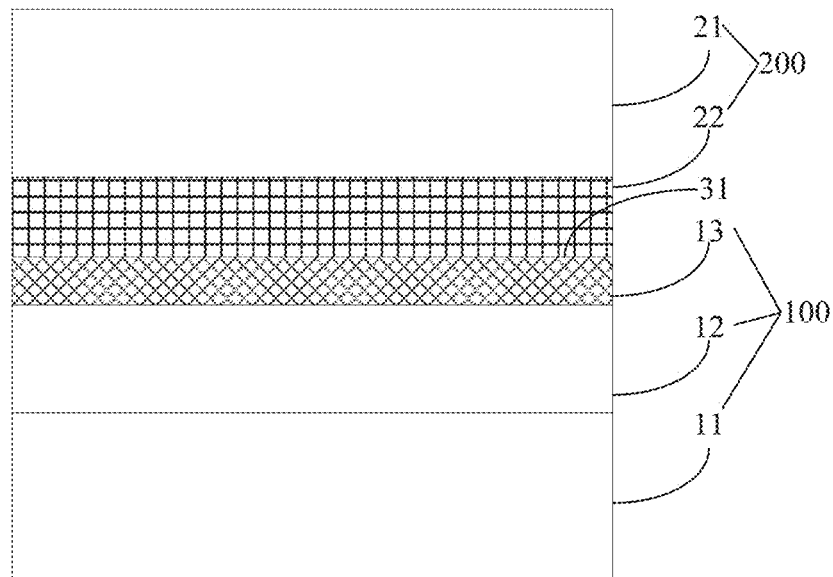
FIG. 13 illustrates a schematic view of an exemplary structure of metal-dielectric bonding consistent with various disclosed embodiments of the present disclosure.

FIG. 13 illustrates a schematic view of an exemplary structure of metal-dielectric bonding consistent with various disclosed embodiments of the present disclosure. Referring to FIG. 13, the first semiconductor structure is bonded with the second semiconductor structure by bonding the metal bonding surface with the dielectric bonding surface. In some embodiments, referring to FIG. 13, the second semiconductor structure may be oriented upside down, such that the dielectric bonding surface is oriented downward. Further, the metal bonding surface is oriented upward. Accordingly, the dielectric bonding surface and the metal bonding surface face toward each other and bonded together.

A bonding interface 31 is form between the first semiconductor structure 100 and the second semiconductor structure 200. The bonding interface 31 is at a plane at which the metal bonding surface is in contact with the dielectric bonding surface.

In some embodiments, the first semiconductor structure may be bonded with the second semiconductor structure by bonding the metal bonding surface with the dielectric bonding surface at room temperature. Room temperature may be, for example, in a range from approximately 15° C. to approximately 30° C.

In some embodiments, the first semiconductor structure may be bonded with the second semiconductor structure by bonding the metal bonding surface with the dielectric bonding surface at a temperature lower than room temperature, e.g., a temperature above 0° C. and below approximately 15° C.

In some embodiments, the first semiconductor structure may be bonded with the second semiconductor structure by bonding the metal bonding surface with the dielectric bonding surface at a temperature higher than room temperature, e.g., a temperature in an range from approximately 30° C. to approximately 100° C.

Figure 14:
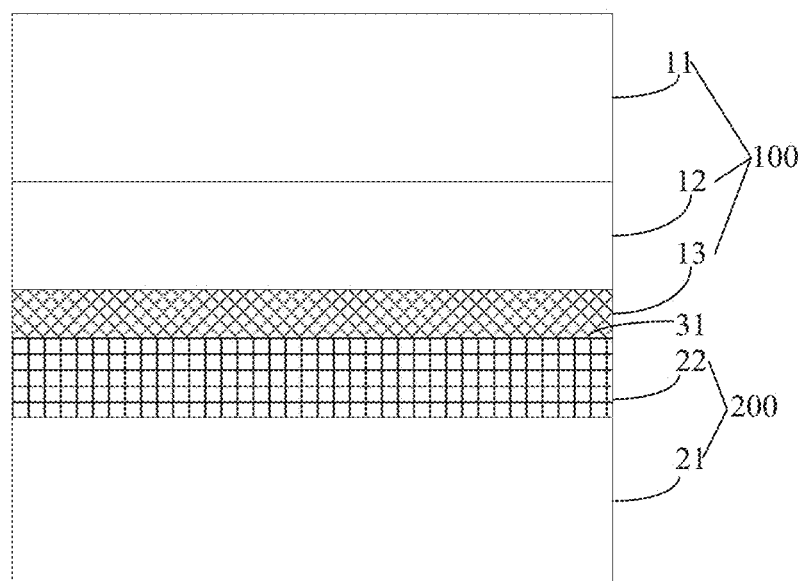
FIG. 14 illustrates another schematic view of an exemplary structure of metal-dielectric bonding consistent with various disclosed embodiments of the present disclosure.

FIG. 14 illustrates another schematic view of an exemplary structure of metal-dielectric bonding consistent with various disclosed embodiments of the present disclosure. Referring to FIG. 14, the first semiconductor structure is bonded with the second semiconductor structure by bonding the metal bonding surface with the dielectric bonding surface. In some embodiments, referring to FIG. 14, the first semiconductor structure may be oriented upside down, such that the metal bonding surface is oriented downward. Further, the dielectric bonding surface is oriented upward. Accordingly, the dielectric bonding surface and the metal bonding surface face toward each other and bonded together.

A bonding interface 31 is form between the first semiconductor structure and the second semiconductor structure. The bonding interface 31 is at a plane at which the metal bonding surface is in contact with the dielectric bonding surface.

In some embodiments, the first semiconductor structure may be oriented such that the metal bonding surface faces toward left, and the second semiconductor structure may be oriented such that the dielectric bonding surface faces toward right. Accordingly, the metal bonding surface and the dielectric bonding surface face toward each other and are bonded with each other.

In some embodiments, the first semiconductor structure may be oriented such that the metal bonding surface faces toward right, and the second semiconductor structure may be oriented such that the dielectric bonding surface face toward left. Accordingly, the metal bonding surface and the dielectric bonding surface face toward each other and are bonded with each other.

The first semiconductor structure may be bonded with the second semiconductor structure having the metal bonding surface and the dielectric bonding surface facing various direction, as long as the metal bonding surface and the dielectric bonding surface face toward each other and are bonded with each other.

In some embodiments, referring to FIG. 1, a heat treatment is applied on the first semiconductor structure and the second semiconductor structure (S680). During the heat treatment, the first semiconductor structure and the second semiconductor structure may be annealed at an annealing temperature. The annealing temperature may be, for example, in a range from approximately 100° C. to approximately 450° C. For example, temperatures of the first semiconductor structure and the second semiconductor structure may be increased from an original temperature to the annealing temperature, kept at the annealing temperature for a preset time period, and further reduced to the original temperature. The original temperature may be, for example, room temperature. The preset time period may be, for example, 1 hour, 1.5 hours, 2 hours, 2.5 hours, etc. The preset time period may be any suitable time period chosen according to various application scenarios.

Figure 15:
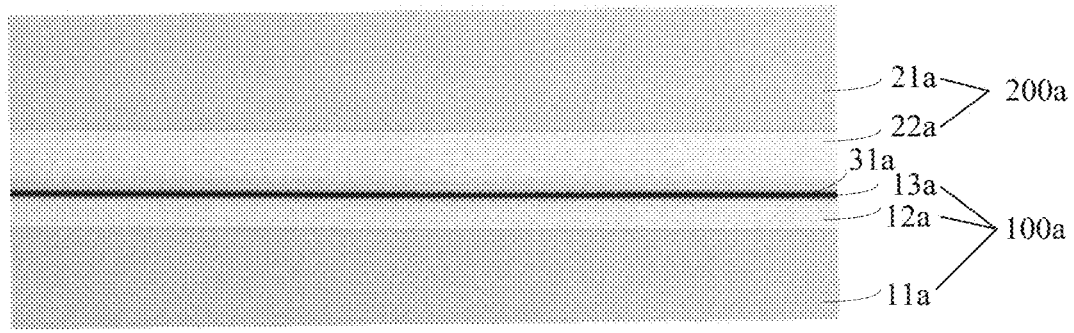
FIG. 15 illustrates a transmission electron microscopy image of an exemplary structure of metal-dielectric bonding consistent with various disclosed embodiments of the present disclosure.

FIG. 15 illustrates a transmission electron microscopy image of an exemplary structure of metal-dielectric bonding consistent with various disclosed embodiments of the present disclosure.

In transmission electron microscopy (TEM), an electron beam is directed toward a sample for imaging. The electron beam passes through the sample, during which electrons interact with the sample. The interactions depend on properties of local areas of the sample. Different local areas having different properties lead to different interactions with electrons, and thus lead to differences in different areas of a corresponding TEM image.

Referring to FIG. 15, the structure of metal-dielectric bonding includes a first semiconductor structure 100a, a second semiconductor structure 200a, and a bonding interface 31a formed between a first semiconductor structure 100a and a second semiconductor structure 200a. The first semiconductor structure 100a includes a first semiconductor layer 11a, a first dielectric layer 12a on the first semiconductor layer 11a, and a first metal layer 13a on the first dielectric layer 12a. The first metal layer 13a includes a metal bonding surface, and the metal bonding surface faces away from the first semiconductor layer 11a. The second semiconductor structure 200a includes a second semiconductor layer 21a and a second dielectric layer 22a on the second semiconductor layer 21a. The second dielectric layer 22a includes a dielectric bonding surface, and the dielectric bonding surface faces away from the second semiconductor layer 21a.

Referring to FIG. 15, the second semiconductor structure 200a is oriented such that the dielectric bonding surface faces downward, and the first semiconductor structure 100a is oriented such that the metal bonding surface faces upward, and the dielectric bonding surface and the metal bonding surface face toward each other, and are bonded with each other. The bonding interface 31a is at a plane at which the metal bonding surface and the dielectric bonding surface are in contact with each other.

The present disclosure provides a structure of metal-dielectric bonding, e.g., a metal-dielectric bonding structure corresponding to any metal-dielectric bonding method according to various embodiments of the present disclosure.

FIG. 13 illustrates a schematic view of an exemplary structure of metal-dielectric bonding consistent with various disclosed embodiments of the present disclosure. Referring to FIG. 13, the exemplary structure of metal-dielectric bonding includes a first semiconductor structure 100, a second semiconductor structure 200, and a bonding interface 31. The second semiconductor structure 200 is on the first semiconductor structure 100, and is bonded with the first semiconductor structure 100.

The first semiconductor structure 100 includes a first semiconductor layer 11, a first dielectric layer 12 on the first semiconductor layer 11, and a first metal layer 13 on the first dielectric layer 12. The first metal layer 13 includes a metal bonding surface, and the metal bonding surface faces away from the first semiconductor layer 11.

In some embodiments, the first semiconductor layer 11 may be, for example, a silicon substrate.

In some embodiment, a material of the first dielectric layer 12 may include, for example, silicon oxide, silicon oxycarbide, silicon nitride, silicon carbon nitride, or any combination thereof.

In some embodiments, a material of the first metal layer 13 may be, for example, tantalum, titanium, copper, or any combination thereof.

The second semiconductor structure 200 includes a second semiconductor layer 21 and a second dielectric layer 22 on the second semiconductor layer 21. The second dielectric layer 22 includes a dielectric bonding surface, and the dielectric bonding surface faces away from the second semiconductor layer 21.

In some embodiments, the second semiconductor layer 21 may be, for example, a silicon substrate.

In some embodiments, a material of the second dielectric layer 22 may include, for example, silicon oxide, silicon oxycarbide, silicon nitride, silicon carbon nitride, or any combination thereof.

Referring to FIG. 13, the second semiconductor structure 200 may be oriented such that the dielectric bonding surface is oriented downward. That is, the direction from the second semiconductor layer 21 to the second dielectric layer 22 points downward. The metal bonding surface is oriented upward. That is, the direction from the first semiconductor layer 11 to the first metal layer 13 points upward. Accordingly, the dielectric bonding surface and the metal bonding surface face toward each other and bonded together.

A bonding interface 31 is form between the first semiconductor structure and the second semiconductor structure. The bonding interface 31 is at a plane at which the metal bonding surface is in contact with the dielectric bonding surface.

FIG. 14 illustrates another schematic view of an exemplary structure of metal-dielectric bonding consistent with various disclosed embodiments of the present disclosure. Referring to FIG. 14, the exemplary structure of metal-dielectric bonding includes a first semiconductor structure 100, a second semiconductor structure 200, and a bonding interface 31. The second semiconductor structure 200 is bonded with the first semiconductor structure 100.

The first semiconductor structure 100 includes a first semiconductor layer 11, a first dielectric layer 12 on the first semiconductor layer 11, and a first metal layer 13 on the first dielectric layer 12. The first metal layer 13 includes a metal bonding surface, and the metal bonding surface faces away from the first semiconductor layer 11.

In some embodiments, the first semiconductor layer 11 may be, for example, a silicon substrate.

In some embodiment, a material of the first dielectric layer 12 may include, for example, silicon oxide, silicon oxycarbide, silicon nitride, silicon carbon nitride, or any combination thereof.

In some embodiments, a material of the first metal layer 13 may be, for example, tantalum, titanium, copper, or any combination thereof.

The second semiconductor structure 200 includes a second semiconductor layer 21 and a second dielectric layer 22 on the second semiconductor layer 21. The second dielectric layer 22 includes a dielectric bonding surface, and the dielectric bonding surface faces away from the second semiconductor layer 21.

In some embodiments, the second semiconductor layer 21 may be, for example, a silicon substrate.

In some embodiments, a material of the second dielectric layer 22 may include, for example, silicon oxide, silicon oxycarbide, silicon nitride, silicon carbon nitride, or any combination thereof.

Referring to FIG. 14, the second semiconductor structure 200 may be oriented such that the dielectric bonding surface is oriented upward. That is, the direction from the second semiconductor layer 21 to the second dielectric layer 22 points upward. The metal bonding surface is oriented downward. That is, the direction from the first semiconductor layer 11 to the first metal layer 13 points downward. Accordingly, the dielectric bonding surface and the metal bonding surface face toward each other and bonded together.

A bonding interface 31 is form between the first semiconductor structure and the second semiconductor structure. The bonding interface 31 is at a plane at which the metal bonding surface is in contact with the dielectric bonding surface.

The above described orientations of the first semiconductor structure and the second semiconductor structure are merely for illustrative purposes and are not intended to limit the scope of the present disclosure. The first semiconductor structure and the second semiconductor structure in the structure of metal-dielectric bonding may have various suitable orientations. For example, in the structure of metal-dielectric bonding, the first semiconductor structure may be oriented such that the metal bonding surface faces toward left, and the second semiconductor structure may be oriented such that the dielectric bonding surface face toward right. Accordingly, the metal bonding surface and the dielectric bonding surface face toward each other and are bonded with each other. As another example, the first semiconductor structure may be oriented such that the metal bonding surface faces toward right, and the second semiconductor structure may be oriented such that the dielectric bonding surface face toward left. Accordingly, the metal bonding surface and the dielectric bonding surface face toward each other and are bonded with each other. The first semiconductor structure and the second semiconductor structure in the structure of metal-dielectric bonding may have any suitable orientations, as long as the metal bonding surface and the dielectric bonding surface face toward each other and are bonded with each other.

Figure 16:
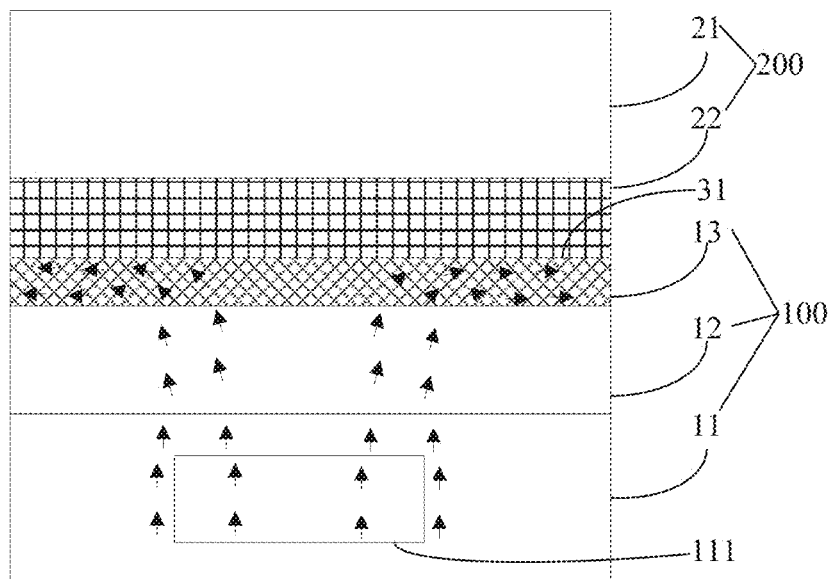
FIG. 16 illustrates another schematic view of an exemplary structure of metal-dielectric bonding consistent with various disclosed embodiments of the present disclosure.

FIG. 16 illustrates another schematic view of an exemplary structure of metal-dielectric bonding consistent with various disclosed embodiments of the present disclosure. Referring to FIG. 16, the structure of metal-dielectric bonding includes a first semiconductor structure 100, a second semiconductor structure 200, and a bonding interface 31. The second semiconductor structure 200 is on the first semiconductor structure 100, and is bonded with the first semiconductor structure 100.

The first semiconductor structure 100 includes a first semiconductor layer 11, a first dielectric layer 12 on the first semiconductor layer 11, and a first metal layer 13 on the first dielectric layer 12. The first metal layer 13 includes a metal bonding surface, and the metal bonding surface faces away from the first semiconductor layer 11. In some embodiments, a material of the first metal layer 13 may be, for example, tantalum, titanium, copper, or any combination thereof.

The second semiconductor structure 200 includes a second semiconductor layer 21 and a second dielectric layer 22 on the second semiconductor layer 21. The second dielectric layer 22 includes a dielectric bonding surface, and the dielectric bonding surface faces away from the second semiconductor layer 21. In some embodiments, a material of the second dielectric layer 22 may include, for example, silicon oxide, silicon oxycarbide, silicon nitride, silicon carbon nitride, or any combination thereof.

The first semiconductor layer 11 may include, for example, a first semiconductor device 111. In some embodiments, the first semiconductor device 111 be, for example, a power device. The power device may generate heat. Such heat may transfer toward the second semiconductor structure 200. The first metal layer 13 may dissipate or redistribute heat generated by the power device, improving operation stability of the power device and/or the second semiconductor structure 200. Referring to FIG. 16, straight arrows may indicate heat generate by the power device, and heat may be dissipated or redistributed by the first metal layer 13. The first metal layer 13 may dissipate heat to the air by itself or dissipate heat by further connecting to a heat dissipating apparatus (not shown). Accordingly, operation stability of the power device and/or the second semiconductor structure 200 can be improved.

In some embodiments, the power device may include, for example, a diode, a power metal-oxide semiconductor field effect transistor (MOSFET), an insulated gate bipolar transistor, a bipolar junction transistor, or any combination thereof.

In some embodiments, the first semiconductor device 111 may be, for example, a device that generates an electromagnetic radiation. The electromagnetic radiation may be, for example, visible light, infrared light, radio wave, ultraviolet, or any combination thereof. The first metal layer 13 may block the electromagnetic radiation from reaching the second semiconductor structure 200, so as to not affect the second semiconductor structure 200 and to facilitate stable operations of the second semiconductor structure 200. For example, the first semiconductor device 111 may be a light-emitting device that generates light, and the first metal layer 13 may block the light from reaching the second semiconductor structure 200.

In some embodiments, the first semiconductor device 111 may be, for example, a device that is exposed to an electromagnetic radiation. The electromagnetic radiation may be, for example, visible light, infrared light, radio wave, ultraviolet, or any combination thereof. The first metal layer 13 may block electromagnetic radiation from reaching the second semiconductor structure 200, so as to not affect the second semiconductor structure 200 and to facilitate stable operations of the second semiconductor structure 200. For example, the first semiconductor device 111 may be a pixel wafer that contains photosensitive pixels and is exposed to light. The first metal layer 13 may block the light from reaching the second semiconductor structure 200. For various features of the structure of metal-dielectric bonding, references can be made to above method embodiments and device embodiments.

Figure 17:
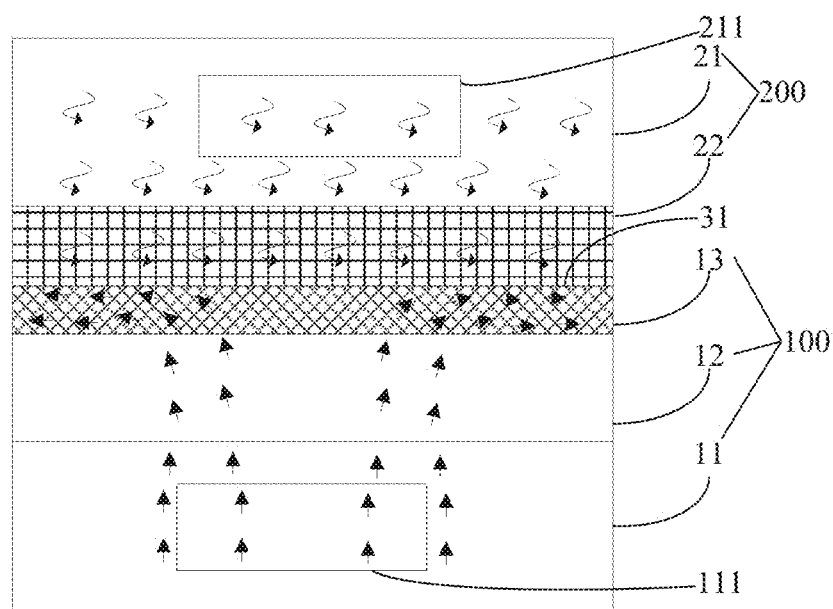
FIG. 17 illustrates another schematic view of an exemplary structure of metal-dielectric bonding consistent with various disclosed embodiments of the present disclosure.

FIG. 17 illustrates another schematic view of an exemplary structure of metal-dielectric bonding consistent with various disclosed embodiments of the present disclosure. Referring to FIG. 17, the structure of metal-dielectric bonding includes a first semiconductor structure 100, a second semiconductor structure 200, and a bonding interface 31. The second semiconductor structure 200 is on the first semiconductor structure 100, and is bonded with the first semiconductor structure 100.

The first semiconductor structure 100 includes a first semiconductor layer 11, a first dielectric layer 12 on the first semiconductor layer 11, and a first metal layer 13 on the first dielectric layer 12. The first metal layer 13 includes a metal bonding surface, and the metal bonding surface faces away from the first semiconductor layer 11.

The second semiconductor structure 200 includes a second semiconductor layer 21 and a second dielectric layer 22 on the second semiconductor layer 21. The second dielectric layer 22 includes a dielectric bonding surface, and the dielectric bonding surface faces away from the second semiconductor layer 21. The dielectric bonding surface is bonded with the metal bonding surface.

The first semiconductor layer 11 may include, for example, a first semiconductor device 111, and the second semiconductor layer 21 may include, for example, a second semiconductor device 211.

In some embodiments, referring to FIG. 17, the first semiconductor device 111 may be, for example, a power device that generates heat, where the heat is indicated by straight filled arrows; and the second semiconductor device 211 may be another device that generates or is exposed to an electromagnetic radiation, where the electromagnetic radiation is indicated by curved arrows. The electromagnetic radiation may be, for example, visible light, infrared light, radio wave, ultraviolet, or any combination thereof. The first metal layer 13 may dissipate or redistribute heat generated by the power device; and the first metal layer 13 may block the electromagnetic radiation from reaching the first semiconductor device 111, so as to facilitate stable operations of the second semiconductor structure 200 and/or the first semiconductor layer 11 of the first semiconductor structure 100.

For example, the first semiconductor device 111 may be a CMOS device that generates heat, and the second semiconductor device 211 may be a pixel wafer that contains photosensitive pixels and is exposed to visible light or infrared light. The first metal layer 13 may dissipate or redistribute heat generated by the CMOS device, and may block the light from reaching the first semiconductor layer 11.

A metal-dielectric bonding method and a corresponding metal-dielectric bonding structure consistent with present disclosure can have applications for a CMOS image sensor (CIS) and/or a memory device.

In some embodiments, the first semiconductor device 111 may be, for example, a COMS device of a COMS image sensor (CIS), and the second semiconductor device 211 may be, for example, a pixel wafer of the CIS. The pixel wafer of the CIS may include a plurality of pixels. The metal-dielectric bonding structure may further include other components to perform operations of a CIS sensor. For example, the metal-dielectric structure may further include a color filter array to filter light for the pixel wafer, and connections between the COMS device and the pixel wafer.

In other embodiments, the first semiconductor device 111 may be, for example, a CIS sensor. The first semiconductor structure 100 that includes the CIS sensor may be bonded to the second semiconductor structure 200. The second semiconductor device 211 may include, for example, a memory for storing data collected by the CIS sensor or data used by the CIS image sensor. The memory may be, for example, a DRAM, a NAND flash memory, a NOR flash memory, any combination thereof, or any other suitable memory.

In some embodiments, the first semiconductor device 111 may include, for example, a memory for storing data. The memory may be, for example, a DRAM, a NAND flash memory, a NOR flash memory, any combination thereof, or any other suitable memory. The second semiconductor device 211 may be, for example, a semiconductor device that collects data and stores collected date in the memory, or a semiconductor device that uses data stored in the memory.

The second semiconductor device 211 may be, for example, a sensor or a hardware processor.

Although the principles and implementations of the present disclosure are described by using specific embodiments in the specification, the foregoing descriptions of the embodiments are only intended to help understand the method and core idea of the method of the present disclosure. Meanwhile, a person of ordinary skill in the art may make modifications to the specific implementations and application range according to the idea of the present disclosure. In conclusion, the content of the specification should not be construed as a limitation to the present disclosure.

What is claimed is:

1. A metal-dielectric bonding method, comprising:
   providing a first semiconductor structure including:
      a first semiconductor layer,
      a first dielectric layer on the first semiconductor layer, and
      a first metal layer on the first dielectric layer, the first metal layer having a metal bonding surface facing away from the first semiconductor layer;
   planarizing the metal bonding surface;
   applying a plasma treatment on the metal bonding surface;
   providing a second semiconductor structure including:
      a second semiconductor layer, and
      a second dielectric layer on the second semiconductor layer, the second dielectric layer having a dielectric bonding surface facing away from the second semiconductor layer;
   planarizing the dielectric bonding surface;
   applying a plasma treatment on the dielectric bonding surface; and
   bonding the first semiconductor structure with the second semiconductor structure by bonding the metal bonding surface with the dielectric bonding surface, wherein one of the metal bonding surface and the dielectric bonding surface entirely covers and is in direct contact with an other of the metal bonding surface and the dielectric bonding surface.

2. The bonding method according to claim 1, before bonding the first semiconductor structure with the second semiconductor structure, further comprising:
   cleaning the metal bonding surface; and
   cleaning the dielectric bonding surface.

3. The bonding method according to claim 2, wherein:
   cleaning the metal bonding surface includes using a hydrophilic chemical substance to clean the metal bonding surface.

4. The bonding method according to claim 3, wherein:
   the hydrophilic chemical substance is ammonia solution or a weak acid, and
   the weak acid includes hydrofluoric acid, benzoic acid, acetic acid, propanoic acid, or acrylic acid.

5. The bonding method according to claim 1, wherein:
   applying the plasma treatment on the metal bonding surface includes treating the metal bonding surface using nitrogen plasma, oxygen plasma, argon plasma, or argon-hydrogen plasma.

6. The bonding method according to claim 1, wherein bonding the first semiconductor structure with the second semiconductor structure includes:
   forming a bonding interface between the first semiconductor structure and the second semiconductor structure.

7. The bonding method according to claim 1, wherein bonding the first semiconductor structure with the second semiconductor structure includes:
   bonding the first semiconductor structure with the second semiconductor structure at room temperature ranging from approximately 15° C. to approximately 30° C.

8. The bonding method according to claim 1, wherein bonding the first semiconductor structure with the second semiconductor structure includes:
   bonding the first semiconductor structure with the second semiconductor structure at a temperature above 0° C. and below approximately 15° C. or a temperature in an range from approximately 30° C. to approximately 100° C.

9. The bonding method according to claim 1, wherein planarizing the metal bonding surface includes:
   reducing a surface roughness of the metal bonding surface to approximately 0.5 nm or less by a chemical mechanical planarization.

10. The bonding method according to claim 1, wherein:
    the first semiconductor layer includes a power device that generates heat; and
    the first metal layer is formed to dissipate the heat generated by the power device.

11. The bonding method according to claim 10, wherein:
    the power device is a diode, a power metal-oxide semiconductor field effect transistor, an insulated gate bipolar transistor, a bipolar junction transistor, or a combination thereof.

12. The bonding method according to claim 1, wherein:
    the first semiconductor layer includes a device that generates an electromagnetic radiation; and
    the first metal layer blocks the electromagnetic radiation from reaching to the second semiconductor structure.

13. The bonding method according to claim 1, wherein:
    the first semiconductor layer includes a complementary metal-oxide-semiconductor device; and
    the second semiconductor layer includes a pixel wafer.

14. The bonding method according to claim 1, wherein:
    the first semiconductor layer includes a complementary metal-oxide-semiconductor device image sensor.

15. The bonding method according to claim 1, wherein:
    the first semiconductor layer includes a dynamic random-access memory, a NAND flash memory, a NOR flash memory, or a combination thereof.

16. The bonding method according to claim 1, wherein:
    a material of the first metal layer is tantalum, titanium, copper, or a combination thereof.

17. The bonding method according to claim 1, wherein:
    a material of the first dielectric layer includes silicon oxide, silicon oxycarbide, silicon nitride, silicon carbon nitride, or a combination thereof.

18. The bonding method according to claim 1, after bonding the first semiconductor structure with the second semiconductor structure, further comprising:
    annealing the first semiconductor structure and the second semiconductor structure at an annealing temperature in a range from approximately 100° C. to approximately 450° C.

19. The bonding method according to claim 1, wherein:
    planarizing the metal bonding surface is performed before applying the plasma treatment on the metal bonding surface; and
    planarizing the dielectric bonding surface is performed before applying the plasma treatment on the dielectric bonding surface.

20. The bonding method according to claim 1, wherein:
the first semiconductor layer includes a first semiconductor device,
the first metal layer is bonded with the second dielectric layer and is associated with the second semiconductor device to block electromagnetic radiation related to the second semiconductor device, and
the first metal layer is further connected to a heat dissipating apparatus for heat dissipation of the first semiconductor device.

\* \* \* \* \*